(12) United States Patent
Lue

(10) Patent No.: US 8,101,989 B2
(45) Date of Patent: Jan. 24, 2012

(54) CHARGE TRAPPING DEVICES WITH FIELD DISTRIBUTION LAYER OVER TUNNELING BARRIER

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 81 days.

(21) Appl. No.: 11/756,559

(22) Filed: May 31, 2007

(65) Prior Publication Data

US 2008/0116506 A1      May 22, 2008

Related U.S. Application Data

(60) Provisional application No. 60/866,589, filed on Nov. 20, 2006, provisional application No. 60/866,661, filed on Nov. 21, 2006.

(51) Int. Cl.
*H01L 29/788* (2006.01)

(52) U.S. Cl. ........ 257/315; 257/310; 257/321; 257/324; 257/E27.078

(58) Field of Classification Search .................. 257/315, 257/51, 316, 321, 322, 335, 336, 310, 324; 438/267; 365/185.18
See application file for complete search history.

(56) References Cited

U.S. PATENT DOCUMENTS

| | | | |
|---|---|---|---|
| 4,630,086 A | 12/1986 | Sato et al. | |
| 5,286,994 A | 2/1994 | Ozawa et al. | |
| 5,319,229 A | 6/1994 | Shimoji et al. | |
| 5,851,881 A * | 12/1998 | Lin et al. | 438/261 |
| 5,952,692 A | 9/1999 | Nakazato et al. | |
| 6,011,725 A | 1/2000 | Eitan et al. | |
| 6,026,026 A | 2/2000 | Chan et al. | |
| 6,074,917 A | 6/2000 | Chang et al. | |
| 6,133,603 A | 10/2000 | Nomoto | |
| 6,169,693 B1 | 1/2001 | Chan et al. | |
| 6,218,700 B1 | 4/2001 | Papadas et al. | |
| 6,287,915 B1 | 9/2001 | Muramatsu | |
| 6,333,214 B1 | 12/2001 | Kim et al. | |
| 6,512,696 B1 | 1/2003 | Fan et al. | |

(Continued)

FOREIGN PATENT DOCUMENTS

DE      19929926 A1      12/1999

(Continued)

OTHER PUBLICATIONS

European Search Report from EP07252779 mailed Nov. 5, 2009, 7 pages.

(Continued)

*Primary Examiner* — Wai-Sing Louie
(74) *Attorney, Agent, or Firm* — Haynes Beffel & Wolfeld LLP

(57) ABSTRACT

A memory cell comprising: a semiconductor substrate with a surface with a source region and a drain region disposed below the surface of the substrate and separated by a channel region; a tunneling barrier dielectric structure with an effective oxide thickness of greater than 3 nanometers disposed above the channel region; a conductive layer disposed above the tunneling barrier dielectric structure and above the channel region; a charge trapping structure disposed above the conductive layer and above the channel region; a top dielectric structure disposed above the charge trapping structure and above the channel region; and a top conductive layer disposed above the top dielectric structure and above the channel region are described along with devices thereof and methods for manufacturing.

13 Claims, 10 Drawing Sheets

U.S. PATENT DOCUMENTS

| | | | |
|---|---|---|---|
| 6,605,840 B1 * | 8/2003 | Wu | 257/315 |
| 6,657,253 B2 | 12/2003 | Kim et al. | |
| 6,709,928 B1 | 3/2004 | Jenne et al. | |
| 6,713,315 B2 * | 3/2004 | Kuo et al. | 438/72 |
| 6,720,630 B2 | 4/2004 | Mandelman et al. | |
| 6,784,480 B2 | 8/2004 | Bhattacharyya | |
| 6,818,558 B1 | 11/2004 | Rathor et al. | |
| 6,897,533 B1 | 5/2005 | Yang et al. | |
| 6,912,163 B2 | 6/2005 | Zheng et al. | |
| 6,977,201 B2 | 12/2005 | Jung et al. | |
| 7,075,828 B2 | 7/2006 | Lue et al. | |
| 7,115,469 B1 | 10/2006 | Halliyal et al. | |
| 7,115,942 B2 | 10/2006 | Wang | |
| 7,133,313 B2 | 11/2006 | Shih et al. | |
| 7,151,692 B2 | 12/2006 | Wu et al. | |
| 7,164,603 B2 | 1/2007 | Shih et al. | |
| 7,187,590 B2 | 3/2007 | Zous et al. | |
| 7,190,614 B2 | 3/2007 | Wu et al. | |
| 7,209,390 B2 | 4/2007 | Lue et al. | |
| 7,569,468 B2 * | 8/2009 | Chen et al. | 438/593 |
| 2003/0025147 A1 | 2/2003 | Nomoto et al. | |
| 2003/0030100 A1 | 2/2003 | Lee et al. | |
| 2003/0032242 A1 | 2/2003 | Lee et al. | |
| 2003/0042534 A1 | 3/2003 | Bhattacharyya | |
| 2003/0047755 A1 | 3/2003 | Lee et al. | |
| 2003/0146465 A1 | 8/2003 | Wu | |
| 2003/0224564 A1 | 12/2003 | Kang et al. | |
| 2004/0079983 A1 | 4/2004 | Chae et al. | |
| 2004/0102002 A1 * | 5/2004 | Sandhu et al. | 438/240 |
| 2004/0183126 A1 | 9/2004 | Bae et al. | |
| 2004/0238974 A1 | 12/2004 | Baik | |
| 2004/0256679 A1 | 12/2004 | Hu | |
| 2005/0006696 A1 * | 1/2005 | Noguchi et al. | 257/316 |
| 2005/0023603 A1 | 2/2005 | Eldridge et al. | |
| 2005/0074937 A1 | 4/2005 | Jung | |
| 2005/0093054 A1 | 5/2005 | Jung | |
| 2005/0219906 A1 | 10/2005 | Wu | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0270849 A1 | 12/2005 | Lue | |
| 2005/0281085 A1 | 12/2005 | Wu | |
| 2006/0088983 A1 | 4/2006 | Fujisawa et al. | |
| 2006/0124991 A1 | 6/2006 | Ohba | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202261 A1 | 9/2006 | Lue et al. | |
| 2006/0258090 A1 | 11/2006 | Bhattacharyya et al. | |
| 2006/0261401 A1 | 11/2006 | Bhattacharyya | |
| 2006/0281260 A1 | 12/2006 | Lue | |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0045718 A1 | 3/2007 | Bhattacharyya | |
| 2007/0069283 A1 | 3/2007 | Shih et al. | |

FOREIGN PATENT DOCUMENTS

| | | |
|---|---|---|
| EP | 0016246 | 10/1980 |
| EP | 1411555 | 4/2004 |
| JP | 11040682 | 2/1999 |
| JP | 2003068893 A | 3/2003 |
| JP | 2004363329 | 12/2004 |
| JP | 2005184029 | 7/2005 |
| JP | 2005197624 A | 7/2005 |
| JP | 2006190990 | 7/2006 |

OTHER PUBLICATIONS

White et al., "On the Go with SONOS" IEEE Circuits and Devices, Jul. 2000, 22-31.

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Yeh, C.C., et al., "PHINES: A Novel Low Power Program/Erase, Small Pitch, 2-Bit per Cell Flash Memory," IEDM Tech Digest 2002, 931-934.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4, 2003.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4, 2003.

Baik, Seung, et al., "High Speed and Nonvolatile Si Nanocrystal Memory for Scaled Flash Technology using Highly Field-Sensitive Tunnel Barrier," IEEE IEDM 03-545, 22.3.1-22.3.4, 2003.

Lee, Chang, et al., "A Novel SONOS Structure of SiO2/SiN/Al2O3 with TaN Metal Gate for Multi-Giga Bit Flash Memeries," IEEE 2003, 4 pages.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Shih et al., "A Novel 2-bit/cell Nitride Storage Flash memory with Greater than 1M P/E-cycle Endurance," IEEE IEDM 2004, pp. 36.3.1-36.3.4.

Blomme, et al., "Multilayer tunneling barriers for nonvolatile memory applications," 60th Device Resarch Conf., 2002, Conf. Digest 153-154.

Blomme, et al., Write/Erase Cycling Endurance of Memory Cells with SiO2/HfO2 Tunnel Dielectric, IEEE Trans on Device and Materials Reliability, vol. 4, No. 3, Sep. 2004, 345-351.

Govoreanu, et al, "VARIOT: A Novel Multilayer Tunnel Barrier Concept for Low-Voltage Nonvolatile Memory Devices," IEEE Electron Device Lett., vol. 24, No. 2, Feb. 2003, 99-101.

Govoreanu et al., "Simulation of Nanofloating Gate Memory with High-k Stacked Dielectrics," IEEE SISPAD Int'l Conf. 305 Sep. 2003, 299-302.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Kim et al., "Robust Multi-bit Programmable Flash Memory Using a Resonant Tunnel Barrier," Electron Dev. Mtg. Dec. 5-7, 2005, IEDM Tech Dig. 861-864.

Likharev, "Layered tunnel barriers for nonvolatile memory devices," Applied Physics Lett, vol. 73, No. 15, Oct. 1998, 2137-2139.

Lue et al., "BE-SONOS: A Bandgap Engineered SONOS with Excellent Performance and Reliability," IEDM Tech Digest, IEEE Int'l Dec. 2005, 547-550.

Sung, et al., "Multi-layer SONOS with Direct Tunnel Oxide for High Speed and Long Retention Time," IEEE 2002 Nanoelectronics Workshop, Jun. 2002, 83-84.

Aminzadeh et al., "Conduction and Charge Trapping in Polysilicon-Silicon Nitride-Oxide-Silicon Structures under Positive Gate Bias," IEEE Transactions on Electron Devices, vol. 35, No. 4, Apr. 1998, 459-467.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

Tsai et al., "Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Maikap, S., et al., "High-k HfO2/TiO2/HfO2 multilayer quantum well flash memory devices," Int'l Symp on VLSI Technology, Sytems and Applications Apr. 23-25, 2007, pp. 1-2.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Office Action mailed Nov. 23, 2007 in U.S. Appl. No. 11/197,668.

Office Action mailed Oct. 19, 2007 in U.S. Appl. No. 11/324,495.

* cited by examiner

CHARGE TRAPPING DEVICES WITH FIELD DISTRIBUTION LAYER OVER TUNNELING BARRIER

RELATED APPLICATIONS

This application claims the benefit of U.S. Provisional Application Ser. No. 60/866,661 filed 21 Nov. 2006, and of U.S. Provisional Application Ser. No. 60/866,589 filed 20 Nov. 2006.

BACKGROUND OF THE INVENTION

1. Field of the Invention

The invention relates generally to non-volatile memory devices, and in particular to flash memory cells and manufacturing of flash memory devices.

2. Description of Related Art

Flash memory technology includes memory cells that store charge between the channel and gate of a field effect transistor. The charge stored affects the threshold of the transistor, and the changes in threshold due to the stored charge can be sensed to indicate data.

One type of charge storage memory cell in widespread application is known as a floating gate memory cell. In a floating gate memory cell, a floating gate of conductive material such as polysilicon is formed over a tunnel dielectric, and an inter-poly dielectric is formed over the floating gate to isolate it from the word line or control gate of the memory cell. The geometry of the floating gate is engineered to establish a high coupling ratio for a voltage between the floating gate and channel, so that a voltage applied on the control gate will result in a stronger electric field across the tunnel dielectric than across the inter-poly dielectric. For example, floating gates are implemented using a T-shape or a U-shape, which results in a greater surface area between the control gate and the floating gate than between the floating gate and the channel, and thereby a greater capacitance between the floating gate and the control gate. Although this technology has been widely successful, as the sizes of the memory cells and the distances between them shrink, the floating gate technology starts to degrade because of interference between neighboring floating gates.

Another type of memory cell based on storing charge between the channel and gate of a field effect transistor uses a dielectric charge trapping structure. In this type of memory cell, a dielectric charge trapping structure is formed over a tunnel dielectric which isolates the dielectric charge trapping structure from the channel, and a top dielectric layer is formed over the charge trapping structure to isolate it from the word line or gate. A representative device is known as a silicon-oxide-nitride-oxide-silicon SONOS cell.

In memory cells using dielectric charge trapping structures, the device can be planar because there is no coupling ratio engineering involved in the design. Rather, the electric field when no charge is trapped in the charge trapping structure is equal in the tunneling dielectric and the top dielectric. Because of the planar structure, and very little coupling between adjacent cells, memory cells using dielectric charge trapping structures are forecast to overtake floating gate memory cells in importance as the minimum feature size for the manufacturing processes goes beyond about 45 nm.

It is found that even SONOS-type memory cells can suffer performance degradation as the minimum feature size goes below about 45 nm. In particular, non-uniform injection of charge along the channel width in the dielectric charge trapping structure due to the fringing fields can result in a region along the edge of the memory cell with effectively a low threshold voltage, while regions toward the center of the channel have an effectively high threshold. The low threshold region along the edge can result in performance degradation.

Therefore, it is desirable to maintain a more constant threshold voltage along the channel width dimension even if there is non-uniform charge concentration in the charge trapping structure along the channel width dimension.

SUMMARY OF THE INVENTION

The present invention relates to non-volatile memory devices, and more specifically to non-volatile memory devices including a conductive layer between a tunnel dielectric and a dielectric charge trapping structure, which may have a non-uniform distribution of trapped charge across the channel. The conductive layer distributes the electric field that is affected by the charge trapped in the dielectric charge trapping layer more uniformly across the channel, and results in a more constant threshold voltage beneath the conductive layer along the channel width dimension even if there is non-uniform charge concentration in the charge trapping structure along the channel width dimension.

Accordingly, an embodiment described herein includes a memory cell including a source region and a drain region near a surface of a substrate and separated by a channel region, a tunneling barrier dielectric structure disposed above the channel region with a thickness and dielectric characteristics sufficient to suppress direct tunneling to the charge trapping layer from the substrate by having an effective oxide thickness EOT greater than about 3 nanometers (where EOT is determined by the actual thickness of the material of the tunneling barrier dielectric structure scaled according to the ratio of the dielectric constant of silicon dioxide and the dielectric constant of the material), a conductive layer disposed above the tunneling barrier dielectric structure covering the channel region at least partially, and preferably completely in the channel width dimension, and more preferably in both the channel width and channel length dimension, a dielectric charge trapping structure disposed above the conductive layer, a top dielectric structure disposed above the charge trapping structure, and a top conductive layer disposed above the top dielectric structure. The conductive layer acts to counteract uneven charge distribution in the charge trapping layer by establishing an equipotential surface over the channel and over the tunnel dielectric, distributing the electric field affected by the charge trapped in the charge trapping layer.

In some embodiments the tunneling barrier dielectric structure comprises silicon dioxide or silicon oxynitride. In some embodiments the tunneling barrier dielectric structure comprises a bandgap engineered tunneling barrier structure. In some embodiments the bandgap engineered tunneling barrier structure comprises multiple layers, an example of which comprises a first silicon dioxide layer, a silicon nitride layer disposed above the first silicon dioxide layer, and a second silicon dioxide layer disposed above the silicon nitride layer. In embodiments described herein the tunneling barrier dielectric structure has negligible trapping efficiency.

The conductive layer can be doped polysilicon between 2 to 6 nanometers thick, or other similar conductive materials having conductivity sufficient to act to distribute the field over the channel region. The conductive layer is separated from other conductive materials in the device by insulating materials.

The charge trapping structure in various embodiments comprises silicon nitride, nano-particle embedded dielectrics, or other materials including "high-K" metal oxides like Al₂O₃, Hf₂O₃, etc. In some embodiments of the memory cell described herein, the charge trapping structure over the conductive layer comprises multiple layers, an example of which comprises a bottom dielectric layer and a charge trapping layer disposed above the bottom dielectric layer.

An integrated circuit memory device including cells implemented as described above is also described.

A method for manufacturing a memory cell as described herein comprises forming a tunneling barrier dielectric structure on the surface of a semiconductor substrate, forming a conductive layer on the tunneling barrier dielectric structure, forming a charge trapping structure on the conductive layer, forming a top dielectric structure on the charge trapping structure, forming a top conductive layer on the dielectric structure, and forming a source region and a drain region by implanting dopants in the semiconductor substrate, such that the source region and the drain region are separated by a channel, and the channel is below the tunneling barrier dielectric structure.

In certain embodiments a method of manufacturing includes forming a plurality of isolation structures of dielectric material between the memory cells.

Other aspects and advantages of the present invention can be seen on review of the drawings, the detailed description and the claims, which follow.

DETAILED DESCRIPTION

A detailed description of various embodiments is provided with reference to FIGS. 1-19.

Figure 1:
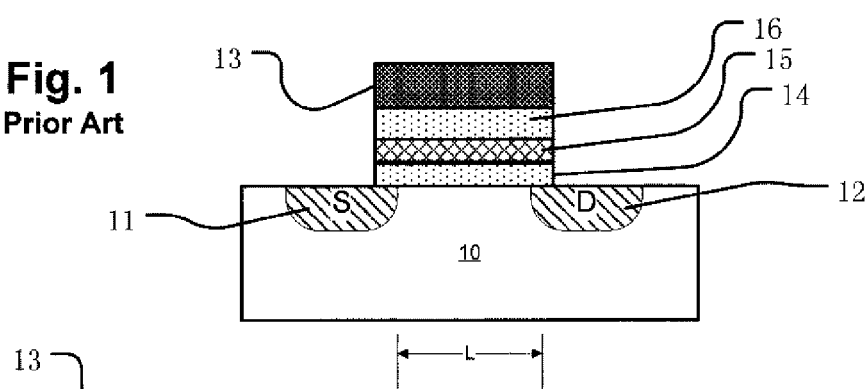
FIG. 1 illustrates the basic structure of a prior art SONOS-type memory cell.

FIG. 1 illustrates the basic structure of a prior art SONOS-type memory cell. The cell is formed on a semiconductor substrate 10 in which a first doped region 11 acts as a source terminal and a second doped region 12 acts as a drain terminal. A control gate 13 is formed over a charge trapping structure which includes a bottom tunneling barrier dielectric 14, a dielectric charge trapping layer 15, and a top dielectric 16. The channel of the memory cell is the region of the substrate 11 between the source terminal 11 and the drain terminal 12. The dimension L shown in FIG. 1 is typically referred to as the channel length L, because current flows between the source and drain along this dimension of the channel. The SONOS-type memory cell shown in FIG. 1 is often configured in a NAND array configuration, in which a column in the array includes sets of memory cells arranged in series between a ground contact and a global bit line contact.

Figure 2:
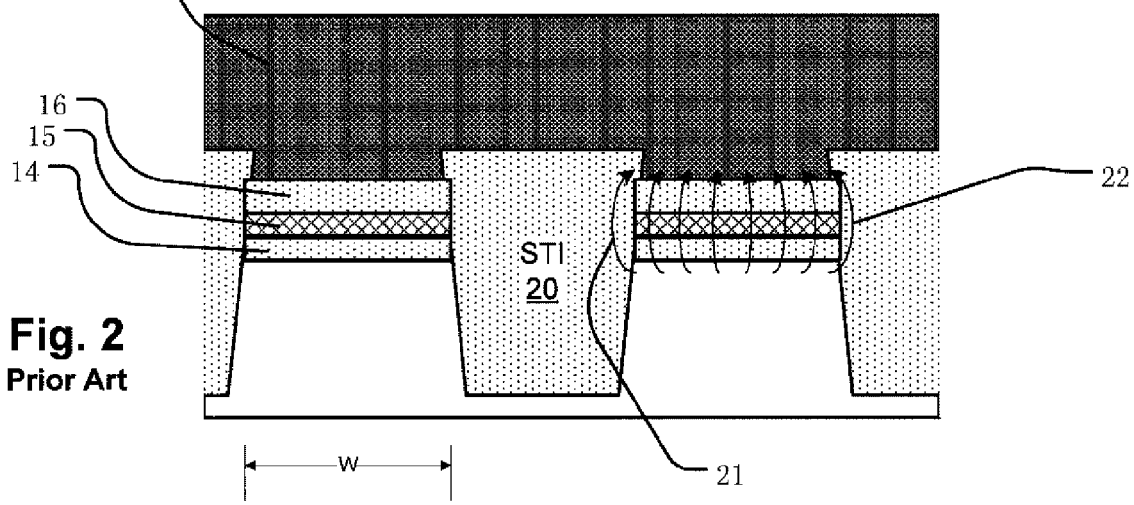
FIG. 2 illustrates a cross-sectional view of basic prior art SONOS-type memory cells taken along the channel width dimension, parallel with the word line in a NAND array configuration.

FIG. 2 illustrates a cross-sectional view of basic prior art SONOS-type memory cells taken along the channel width dimension, parallel with the word line 13 in a NAND array configuration. For perspective, the source and drain terminals are positioned above and below the plane of the drawing of FIG. 2. The individual columns of memory cells are separated by isolation structures, such as shallow trench isolation STI structures 20. In this manner, the columns of memory cells can be positioned in a dense array separated by the width of a shallow trench isolation structure 20 which can be on the order of the minimum feature size F of the technology used for manufacturing the device. Likewise, the channel width W can be on the order of the minimum feature size F for a NAND array configuration as shown. In FIG. 2, the electric field lines through the dielectric layers between the channel and word line 13 are illustrated, including field lines 21 and 22 on the edges of the channel. The field lines 21 and 22 represent fringing fields, which reduce the effectiveness of the charge trapping at the edges of the charge trapping layer 15. In the embodiment illustrated in FIG. 2, the EOT of the combination of the bottom dielectric 14, the charge trapping layer 15, and the top dielectric 16 (typically on the order of 20 nm) is significantly less than the channel width W, and the fringing field effects do not substantially interfere with the operation of the device. The EOT is defined as being equal to the thickness of the dielectric layers scaled by the ratio of the dielectric constant of silicon dioxide to the dielectric constant of the material of the layer.

Figure 3:
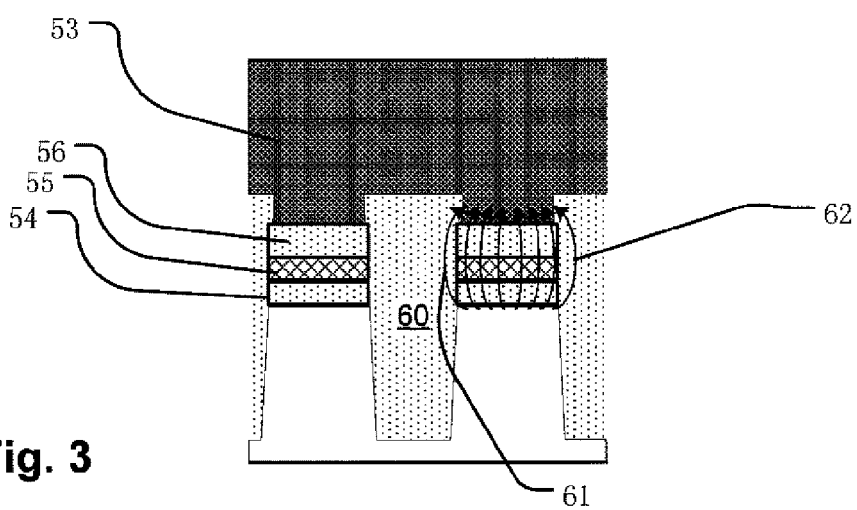
FIG. 3 illustrates a structure similar to FIG. 2 wherein the channel width is reduced to be comparable to the effective oxide thickness of the combination of the bottom dielectric, charge trapping layer, and top dielectric.

It is found that even SONOS-type memory cells can suffer performance degradation as the minimum feature size goes below about 45 nm. For example, FIG. 3 illustrates a structure similar to that of FIG. 2, where the channel width W is reduced to be comparable to the EOT of the combination of the bottom dielectric 54, charge trapping layer 55 and a top dielectric 56. In this embodiment the memory cell includes a polysilicon word line 53, with the columns of cells isolated by STI structures 60. In this embodiment the electric field lines 61 and 62 representing the fringing fields can have a substantial impact on the effectiveness of the charge trapping layer 55. In particular, non-uniform injection of charge into the charge trapping layer along the channel width due to the fringing fields can result in regions along the edges of the channel with effectively a low threshold voltage, while regions toward the center of the channel have an effectively high threshold.

Figure 4:
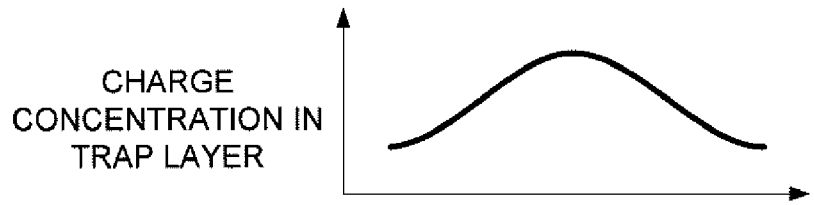
FIG. 4 illustrates uneven charge trapping distribution along the channel width dimension of a prior art memory cell.
Figure 5:
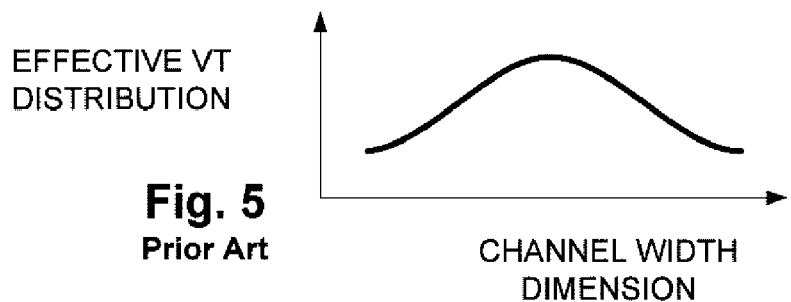
FIG. 5 illustrates uneven charge trapping distribution as shown in FIG. 4 resulting in a distribution of the effective threshold voltage of the memory cell along the channel width dimension.
Figure 6:
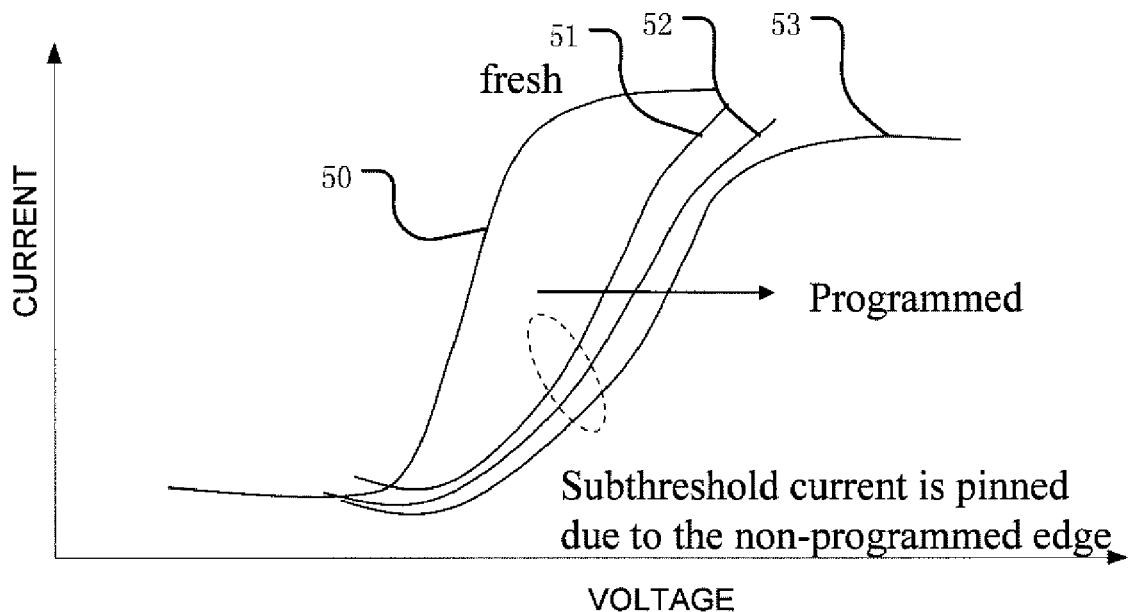
FIG. 6 illustrates drain current through the channel versus gate voltage I-V characteristic of a SONOS-type memory cell suffering from uneven charge trapping distribution.

FIG. 4 illustrates an uneven charge trapping distribution in the charge trapping layer along the channel width dimension of a prior art memory cell. As can be seen in FIG. 4, on the left side of the channel the concentration of charge in the charge trapping layer is low compared to the concentration near the middle of the channel. Also, on the right side of the channel, the concentration of charge in the charge trapping layer is low compared to the concentration near the middle of the channel. FIG. 5 illustrates the uneven charge trapping distribution shown in FIG. 4 resulting in a distribution of the effective threshold voltage of a memory cell along the channel width dimension. Thus a memory cell programmed to a high threshold state may still have low threshold regions along the edges of the cell. FIG. 6 illustrates drain current $I_d$ through the channel versus gate voltage $V_g$ I-V characteristic of a SONOS-type cell suffering from uneven charge distribution caused by the fringing effects. The trace 50 on the left shows good I-V characteristics for a cell that has not been programmed and is "fresh". As the programming proceeds and the charge trapped in the charge trapping layer increases, trace 51, trace 52, and trace 53 illustrate that the I-V characteristics degrade, particularly in the subthreshold region. The subthreshold current is pinned, marked by the dashed oval in the figure, because of the inability to trap charge at the edges of the charge trapping structure.

Figure 7:
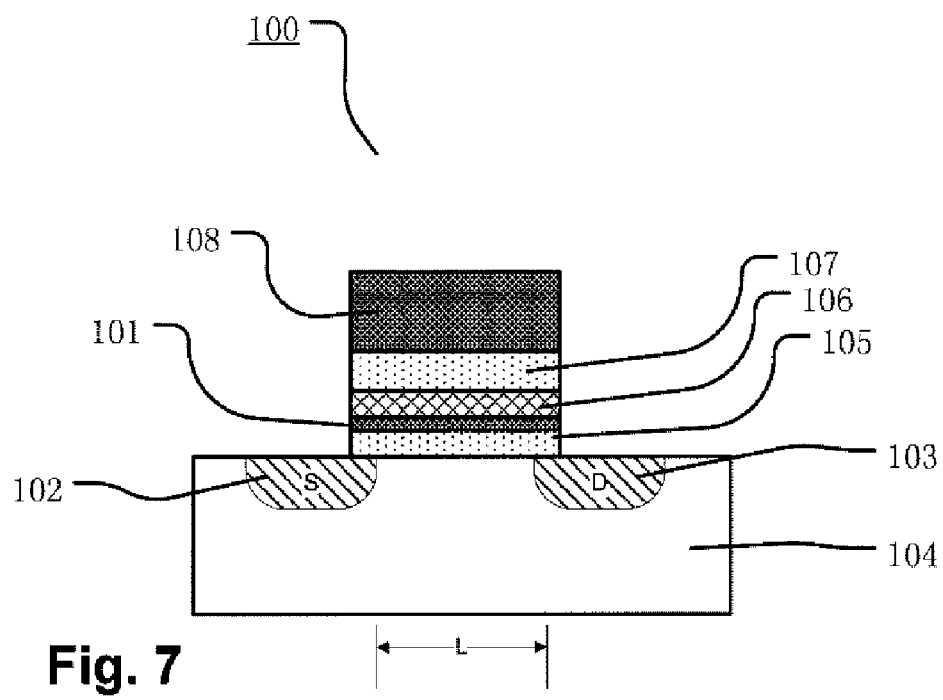
FIG. 7 illustrates a cross-sectional view taken along the channel length dimension of a dielectric charge trapping memory cell including a conductive layer above the tunneling barrier dielectric structure in accordance with one embodiment.

FIG. 7 illustrates a cross-sectional view taken along the channel length dimension L of a dielectric charge trapping memory cell 100 including a conductive layer 101 above the tunneling barrier dielectric structure 105 in accordance with one embodiment. In the embodiment illustrated in FIG. 7, the memory cell 100 includes the substrate 104 with doped region 102 and doped region 103 acting as the source and drain respectively, with doped region 102 and doped region 103 separated by a channel. In the embodiment illustrated in FIG. 7, disposed above the channel, on the surface of the substrate 104, is a tunneling barrier dielectric structure 105 which in this example is a single dielectric layer. In the embodiment illustrated in FIG. 7, the memory cell 100 further includes a conductive layer 101 disposed above the tunneling barrier dielectric structure 105, a charge trapping structure 106 disposed above the conductive layer 101, a top dielectric structure 107 disposed above the charge trapping structure 106, and a top conductive layer 108 disposed above the top dielectric structure 107. In certain embodiments, the tunneling barrier structure 105 can comprise silicon dioxide or silicon oxynitride. In certain embodiments, the tunneling barrier dielectric structure 105 comprises silicon dioxide having a thickness on the order of 4 to 6 nm. In certain embodiments the charge trapping structure 106 comprises silicon nitride, nano-particle embedded dielectrics, or other materials including "high-K" metal oxides like $Al_2O_3$, $Hf_2O_3$, etc. In certain embodiments, the charge trapping structure 106 comprises silicon nitride having a thickness on the order of 5 to 7 nm. In certain embodiments, the top dielectric structure 107 comprises silicon dioxide, or other dielectric material such as a "high-K" metal oxide like $Al_2O_3$, $Hf_2O_3$, etc. In certain embodiments, the top dielectric structure 107 comprises silicon dioxide having a thickness on the order of 5 to 9 nm. Also, in certain embodiments the conductive layer 101 may comprise p-type polysilicon, n-type polysilicon, other doped semiconductor materials, or metals such as aluminum, copper or tungsten. In a representative embodiment, the conductive layer 101 comprises doped polysilicon having a thickness of about 2 to 6 nm. The conductive layer 101 is thin in preferred embodiments, so that interference caused by electric fields between the conductive layers in neighboring cells is small, and does not interfere with the performance of the memory cells, yet thick enough for reliable formation of a layer that provides for electric field distribution. In certain embodiments the top conductive layer 108 may comprise p-type polysilicon, n-type polysilicon, other doped semiconductor materials, or metals such as aluminum, copper or tungsten. The materials chosen in these example embodiments are representative of materials that are easily manufactured. A wide variety of other materials and combinations can also be used for the memory cell layers and structures.

Figure 8:
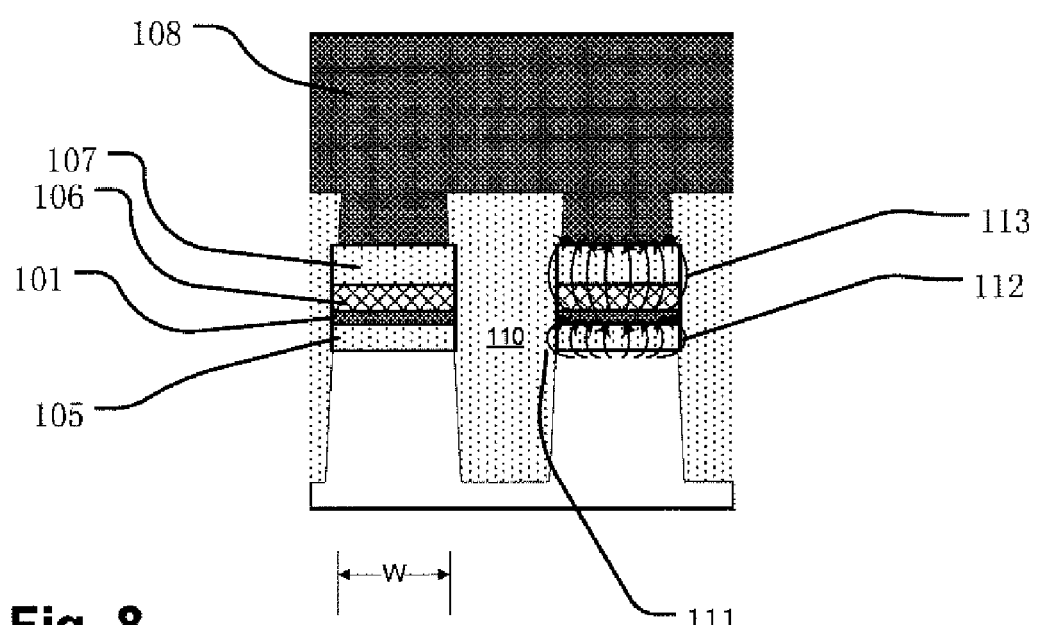
FIG. 8 illustrates a cross-sectional view of an array of memory cells like that shown in FIG. 7 taken along the channel width dimension in accordance with one embodiment.

FIG. 8 illustrates a cross-sectional view of an array of memory cells like that shown in FIG. 7 taken along the channel width dimension in accordance with one embodiment. In the embodiment illustrated in FIG. 8, the memory cells are separated by trench isolation structures 110. In the embodiment illustrated in FIG. 8, the channel width W is comparable in size to the EOT of the tunneling barrier dielectric structure 105, charge trapping structure 106, and top dielectric structure 107 in the memory cell. The conductive layer 101 does not affect the EOT of the memory cell because it is a conductive layer, not a dielectric. One characteristic of the conductive layer 101 is that it is not subject to engineering to induce a large coupling ratio like a floating gate memory cell. Rather, the ratio of the area of the conductive layer 101 disposed above the channel to the area of the channel can be substantially equal to the ratio of the area of the top conductive layer 108 disposed above the channel to the area of the conductive layer 101 disposed above the channel. In this manner, the electric field above the conductive layer 101 is substantially the same as the electric field below the conductive layer 101. Even if some electrons are captured in the conductive layer 101, the large electric field applied during programming will immediately sweep all or most of the electrons into the charge trapping layer 106.

As illustrated in FIG. 8, the fringing fields 111, 112, 113 are terminated by the constant potential of the conductive layer 101. Thus, the fringing field effect in the charge trapping structure 106 is reduced. Furthermore, to the extent that a nonuniform distribution of charge occurs in a memory cell like that illustrated in FIG. 8, the constant potential of the conductive layer 101 will distribute the electric field uniformly across the tunneling barrier dielectric structure 105 and cause the effective distribution of threshold voltage in the channel to be more uniform in the channel width dimension.

Figure 9:
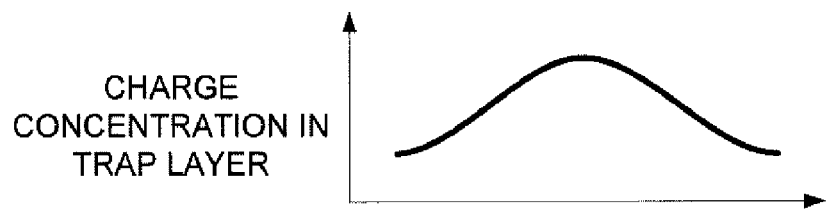
FIG. 9 illustrates an example of charge concentration across the channel width dimension of a dielectric charge trapping memory cell with a conductive layer like that illustrated in FIG. 8.
Figure 10:
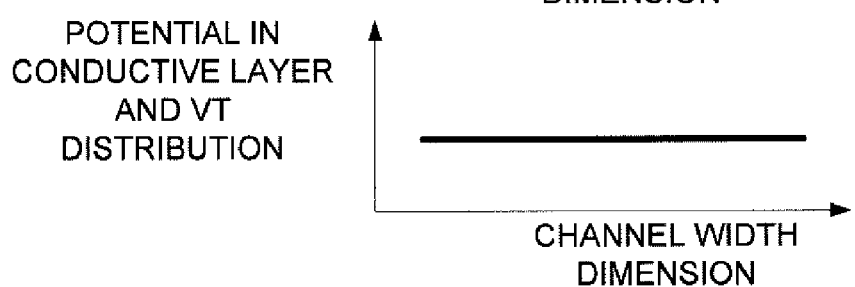
FIG. 10 illustrates constant potential in the conductive layer and the effect the constant potential can have on the distribution of threshold voltage in the channel width dimension.

FIG. 9 illustrates an example of charge concentration across the channel width dimension of a dielectric charge trapping memory cell with a conductive layer like that illustrated in FIG. 8. For this example, the distribution of charge concentration for a memory cell like that illustrated in FIG. 8 is similar to that of a typical SONOS-type memory cell as discussed above. FIG. 10 illustrates the effect the conductive layer 101 can have on the distribution of threshold voltage VT in the channel width dimension. As illustrated in FIG. 10, the constant potential in the conductive layer 101 results in an even distribution of threshold voltage in the channel width dimension. Therefore, even with an uneven distribution of charge in the charge trapping structure 106, the performance of the memory cell does not degrade substantially.

Figure 11:
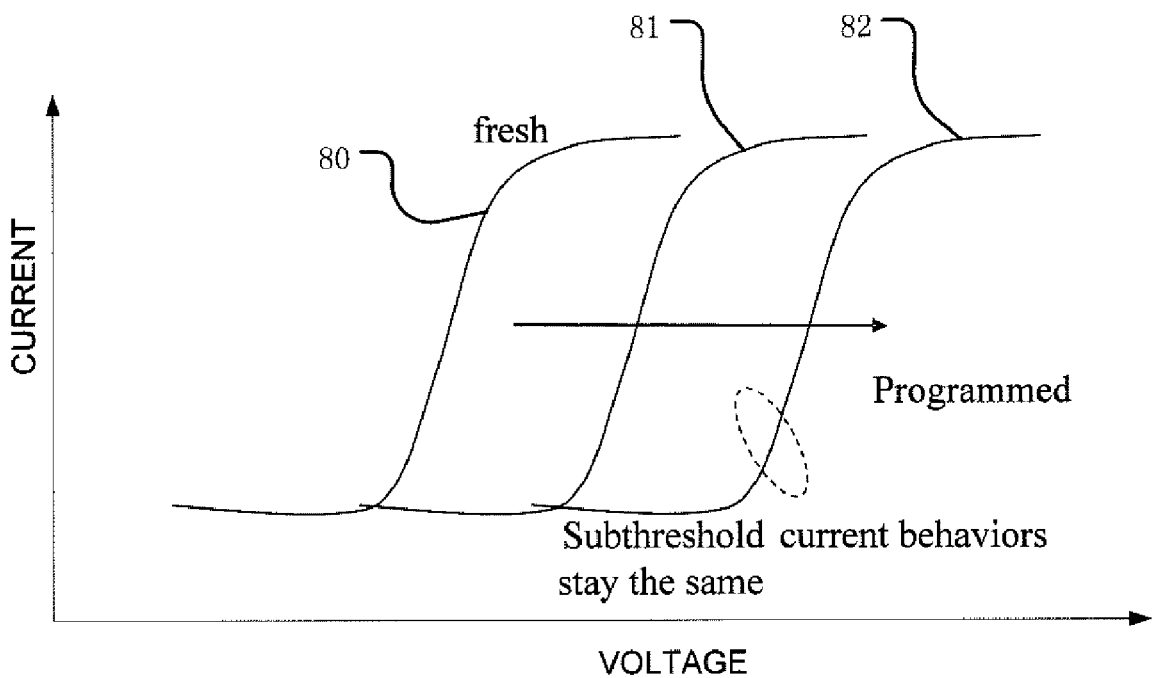
FIG. 11 illustrates a simulation of drain current versus gate voltage I-V characteristics of a dielectric charge trapping memory cell with a conductive layer suffering from uneven charge distribution in accordance with one embodiment.

FIG. 11 illustrates a simulation of the drain current $I_d$ versus gate voltage $V_g$ I-V characteristic of a dielectric charge trapping memory cell with a conductive layer suffering from the uneven charge distribution in the charge trapping structure in accordance with one embodiment. The trace 80 on the left shows good I-V characteristics for a cell that has not been programmed, and is "fresh". As the programming proceeds and the charge trapped in the charge trapping structure increases, trace 81 and trace 82 illustrate that the I-V characteristics do not degrade. The subthreshold current behavior remains consistent as the threshold voltage increases.

Figure 12:
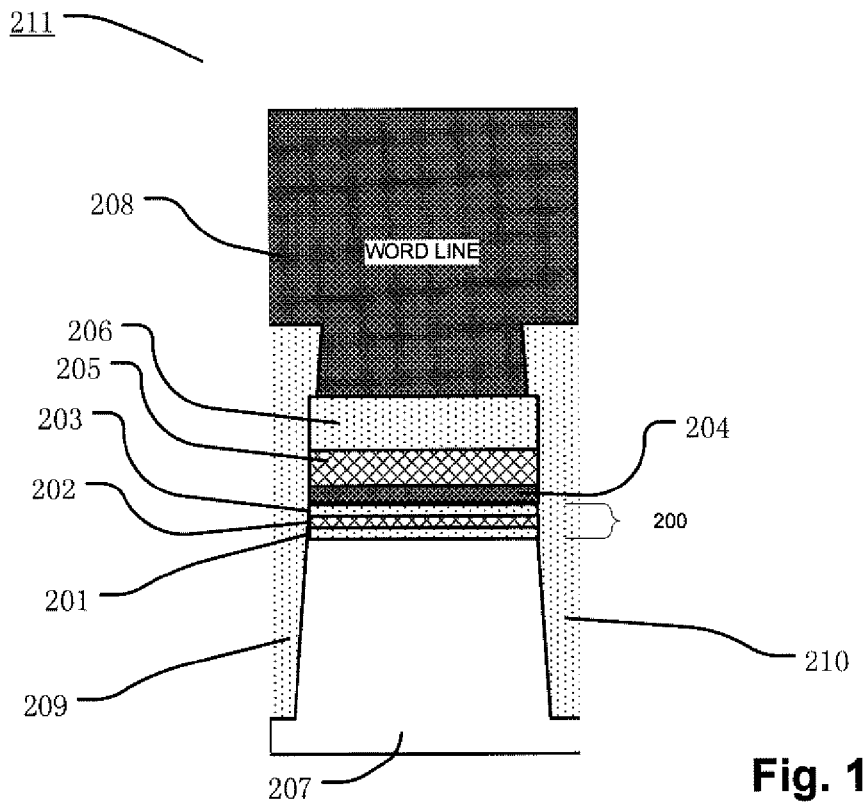
FIG. 12 illustrates a cross-sectional view taken along the channel width dimension of a dielectric charge trapping memory cell with a conductive layer wherein the bottom dielectric structure comprises a bandgap engineered tunneling barrier structure in accordance with one embodiment.

FIG. 12 illustrates a cross-sectional view along the channel width dimension of an alternative embodiment of a dielectric charge trapping memory cell with a conductive layer. In the embodiment illustrated in FIG. 12, the memory cell 211 includes the substrate 207 with channel and doped regions acting as source and drain, isolated from adjacent devices by trench isolation structures 209, 210. In the embodiment illustrated in FIG. 12, disposed above the channel, on the surface of the substrate 207, is a tunneling barrier dielectric structure 200 comprising a bandgap engineered tunneling barrier structure consisting in this example of a thin silicon dioxide layer 201, a thin silicon nitride layer 202, and a thin silicon dioxide layer 203. In the embodiment illustrated in FIG. 12, the memory cell 211 further includes a conductive layer 204 disposed above the tunneling barrier dielectric structure 200, a charge trapping structure 205 disposed above the conductive layer 204, a top dielectric structure 206 disposed above the charge trapping structure 205, and a top conductive layer 208 disposed above the top dielectric structure 206. In certain embodiments the conductive layer 204 may comprise p-type polysilicon, n-type polysilicon, other doped semiconductor materials, or metals such as aluminum, copper, or tungsten. The conductive layer 204 is thin in preferred embodiments, so that interference caused by electric fields between the conductive layers in neighboring cells is small, and does not interfere with the performance of the memory cells, yet thick enough for reliable formation of a layer that provides for electric field distribution. In certain embodiments the charge trapping structure 205 comprises silicon nitride, nano-particle embedded dielectrics, or other materials including "high-K" metal oxides like $Al_2O_3$, $Hf_2O_3$, etc. In certain embodiments, the top dielectric structure 206 comprises silicon dioxide, or other dielectric material such as a "high-K" metal oxide like $Al_2O_3$, $Hf_2O_3$, etc. In certain embodiments the top conductive layer 208 may comprise p-type polysilicon, n-type polysilicon, other doped semiconductor materials, or metals such as aluminum, copper or tungsten. The materials chosen in these example embodiments are representative of materials that are easily manufactured. A wide variety of other materials and combinations can also be used for the memory cell layers and structures. The embodiment of FIG. 12 having a bandgap-engineered tunneling barrier structure can be erased efficiently using a biasing arrangement that causes hole tunneling.

Figure 13:
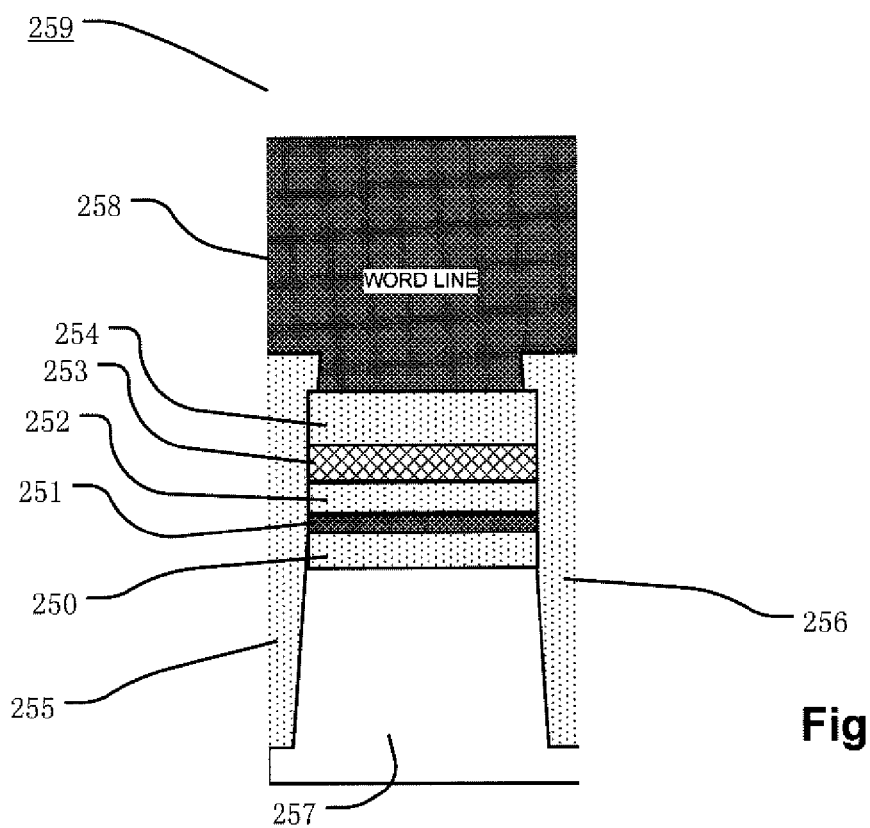
FIG. 13 illustrates a cross-sectional view along the channel width of a dielectric charge trapping memory cell with a conductive layer wherein the charge trapping structure comprises a charge trapping layer disposed on a dielectric layer in accordance with one embodiment.

FIG. 13 illustrates a cross-section along the channel width dimension of yet another alternative embodiment of a dielectric charge trapping memory cell 259 with a conductive layer 251. In the embodiment illustrated in FIG. 13, the memory cell 259 includes the substrate 257 with channel with doped regions acting as source and drain, isolated from adjacent devices by trench isolation structures 255, 256. In the embodiment illustrated in FIG. 13, disposed above the channel, on the surface of the substrate 257, is a tunneling barrier dielectric structure 250 which in this example is a single dielectric layer having an EOT greater than about 3 nm. In the embodiment illustrated in FIG. 13, the memory cell 259 further includes a conductive layer 251 disposed above the tunneling barrier dielectric structure 250, a charge trapping structure disposed above the conductive layer 251 which in this example the charge trapping structure comprises a bottom dielectric layer 252 and a charge trapping layer 253 disposed above the bottom dielectric layer 252, a top dielectric structure 254 disposed above the charge trapping layer 253, and a top conductive layer 258 disposed above the top dielectric structure 254. In certain embodiments, the tunneling barrier structure 250 can comprise silicon dioxide or silicon oxynitride. In certain embodiments, the bottom dielectric layer 252 comprises silicon dioxide. In certain embodiments, the charge trapping layer 253 comprises silicon nitride, nano-particle embedded dielectrics, or other materials including "high-K" metal oxides like $Al_2O_3$, $Hf_2O_3$, etc. In certain embodiments, the top dielectric structure 254 comprises silicon dioxide, or other dielectric material such as a "high-K" metal oxide like $Al_2O_3$, $Hf_2O_3$, etc. Also, in certain embodiments the conductive layer 251 may comprise p-type polysilicon, n-type polysilicon, other doped semiconductor materials, or metals such as aluminum, copper, or tungsten. The conductive layer 251 is thin in preferred embodiments, so that interference caused by electric fields between the conductive layers in neighboring cells is small and does not interfere with the performance of the memory cells, yet thick enough for reliable formation of a layer that provides for electric field distribution. In certain embodiments the top conductive layer 258 may comprise p-type polysilicon, n-type polysilicon, other doped semiconductor materials, or metals such as aluminum, copper or tungsten. The materials chosen in these example embodiments are representative of materials that are easily manufactured. A wide variety of other materials and combinations can be used for the top dielectric structure 254, the tunneling barrier dielectric structure 250, and for the bottom dielectric layer 252. The dielectric layer 252 may block possible conduction between the conductive layer 251 and the charge trapping layer 253.

The memory cell described herein having a conductive layer and dielectric charge trapping structure can be erased using a variety of biasing arrangements. For example, the cell can be biased to induce electron de-trapping from the charge trapping structure by Fowler Nordhiem tunneling through the bottom tunneling barrier dielectric layer, with a negative voltage applied between the gate and channel. In alternative embodiments, a biasing arrangement can be applied to induce substrate hole tunneling, particularly in the embodiment of FIG. 12 using a bandgap engineered tunneling barrier dielectric as the tunneling barrier dielectric structure. The memory cell can be programmed using a biasing arrangement including a positive voltage from the gate to the channel to induce injection of electrons by Fowler Nordhiem tunneling into the charge trapping structure, or using other biasing arrangements.

Figure 14:
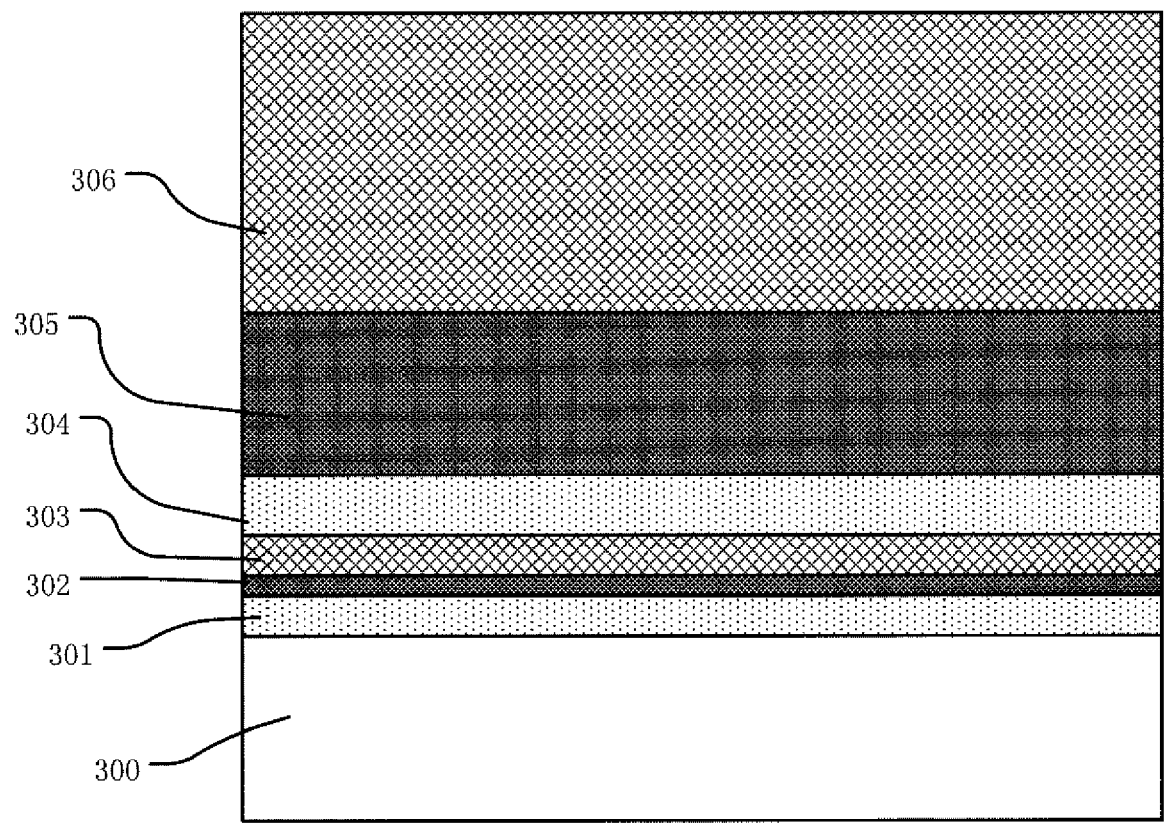
FIG. 14 illustrates a stage in the method for manufacturing a memory array comprising a stack of materials formed on a semiconductor substrate in accordance with one embodiment.

FIGS. 14-18 illustrate an embodiment of a process flow for manufacturing a NAND flash memory array, utilizing a dielectric charge trapping memory cell having a charge distribution layer as described herein. A first stage in accordance with one embodiment of the manufacturing process is illustrated in FIG. 14, in which a stack of materials is formed on a semiconductor substrate 300. First, a tunneling barrier dielectric structure 301, which in this example comprises a tunneling barrier dielectric layer, is formed on the surface of the substrate 300. Next, a conductive layer 302 is formed on the tunneling barrier dielectric structure 301. Next, a charge trapping structure 303, which in this example comprises a charge trapping layer, is formed on the conductive layer 302. Then, a top dielectric structure 304, which in this example is a top dielectric layer, is formed above the top charge trapping structure 303. Next, a top dielectric layer 305 is formed above the top dielectric structure 304. In the embodiment illustrated in FIG. 14, next a hard mask layer 306 is formed over the top dielectric layer 305. In certain embodiments in which the tunneling barrier dielectric structure 301 comprises silicon dioxide, the thickness of the silicon dioxide can be in the range of 3 to 6 nm. In certain embodiments in which the conductive layer 302 comprises polysilicon, the thickness of the polysilicon can be in the range of 2 to 6 nm. In certain embodiments in which the charge trapping structure 303 comprises silicon nitride, the thickness of the silicon nitride can be in the range of 4 to 8 nm. In certain embodiments in which the top dielectric structure 304 comprises silicon dioxide, the thickness of the silicon dioxide can be in the range of 5 to 9 nm. In certain embodiments in which the top conductive layer 305 comprises polysilicon, the thickness of the polysilicon can be about 50 nm. In certain embodiments in which the hard mask layer 306 comprises silicon nitride, the thickness of the silicon nitride can be about 100 nanometers. The layers deposited in this first stage of the manufacturing process can be varied for implementation of the embodiments of FIGS. 12 and 13 as described above, or other similar embodiments.

Figure 15:
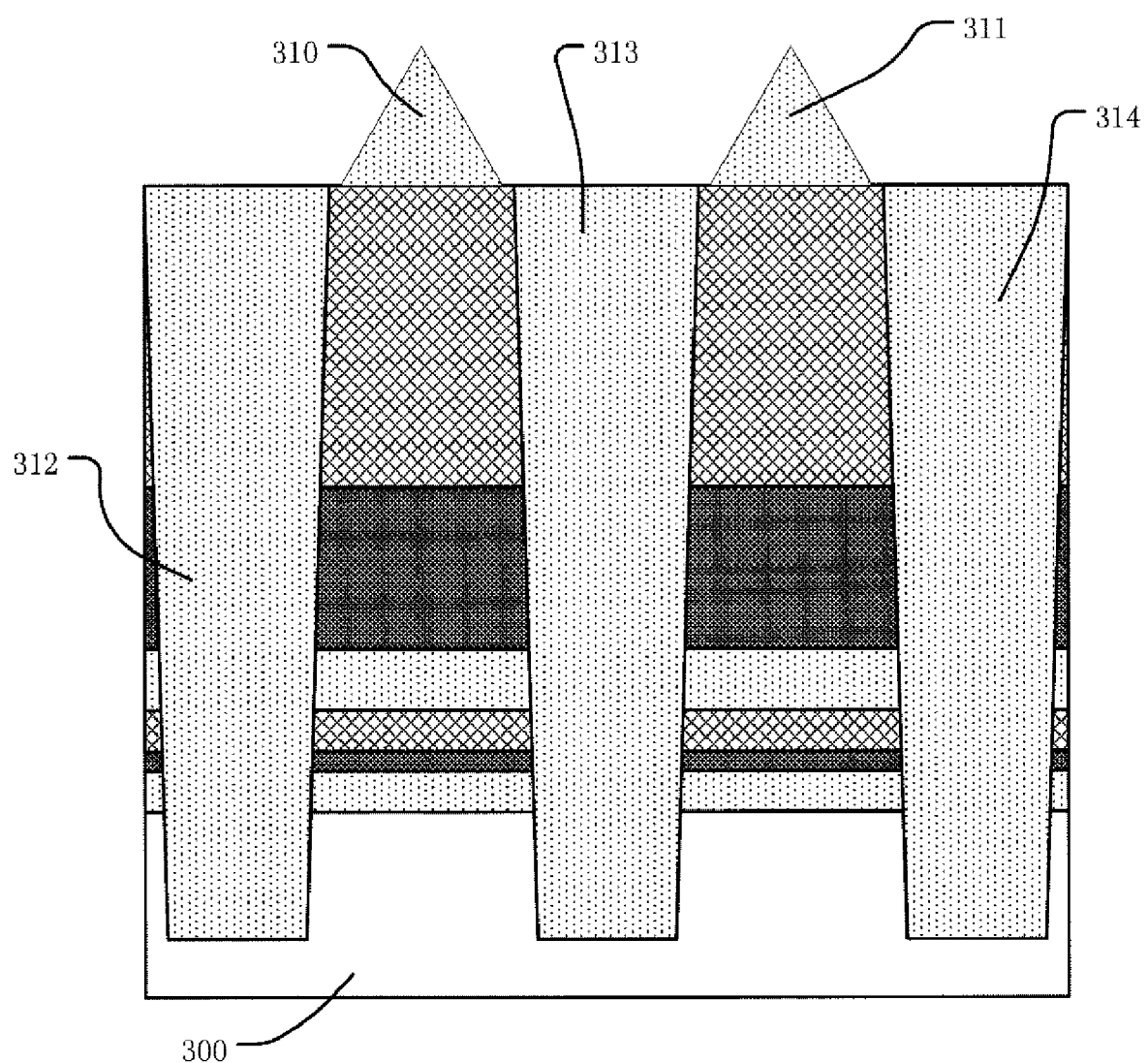
FIG. 15 illustrates a stage in the method for manufacturing a memory array comprising etching of isolation trenches and deposition of dielectric material in the isolation trenches through all layers and through all structures and into the substrate in accordance with one embodiment.

FIG. 15 illustrates a next stage in the manufacturing process in accordance with one embodiment of the process. In this stage, a photolithographic process or other pattern definition process can be used to define the locations of trench isolation structures. Trenches are then etched according to the pattern. The etch goes through the hard mask layer 306, the top conductive layer 305, the top dielectric structure 304, the charge trapping structure 303, the conductive layer 302, the tunneling barrier dielectric structure 301, and into the substrate 300 to define substrate trenches for isolating the rows of memory cells. Next, the gaps are filled with silicon dioxide or other dielectric material using, for example, a high density plasma HDP chemical vapor deposition technology resulting in the hat shaped structures 310, 311 on top of the hard mask layer between the trenches, and trench isolation structures 312, 313, 314 extending into the substrate 300. In certain embodiments the trench isolation structure extends into the substrate by about 200 nm.

Figure 16:
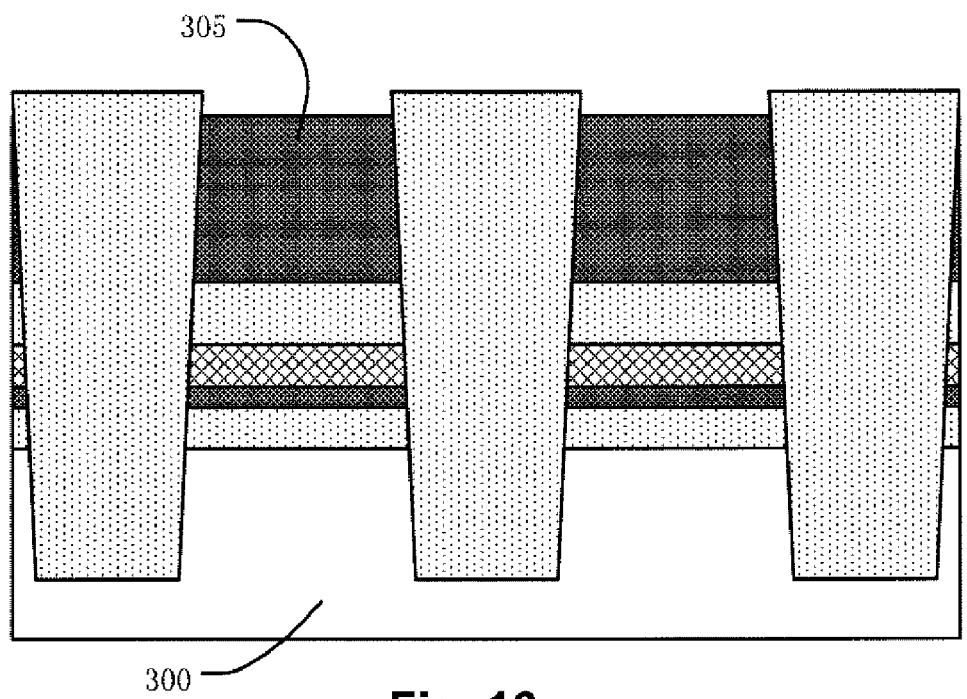
FIG. 16 illustrates a stage in the method for manufacturing a memory array comprising removal of excess oxide from the isolation trench deposition step, stripping of the hard mask layer, and removal of oxide from the top conductive layer in accordance with one embodiment.

FIG. 16 illustrates a next stage in the manufacturing process. The embodiment illustrated in FIG. 16 comprises removal of any excess oxide from the trench isolation deposition process with, for example, chemical mechanical polishing CMP, stripping of the hard mask layer, and removal of oxide from the top conductive layer 305 with, for example, a wet hydrogen fluoride solution dip etch.

Figure 17:
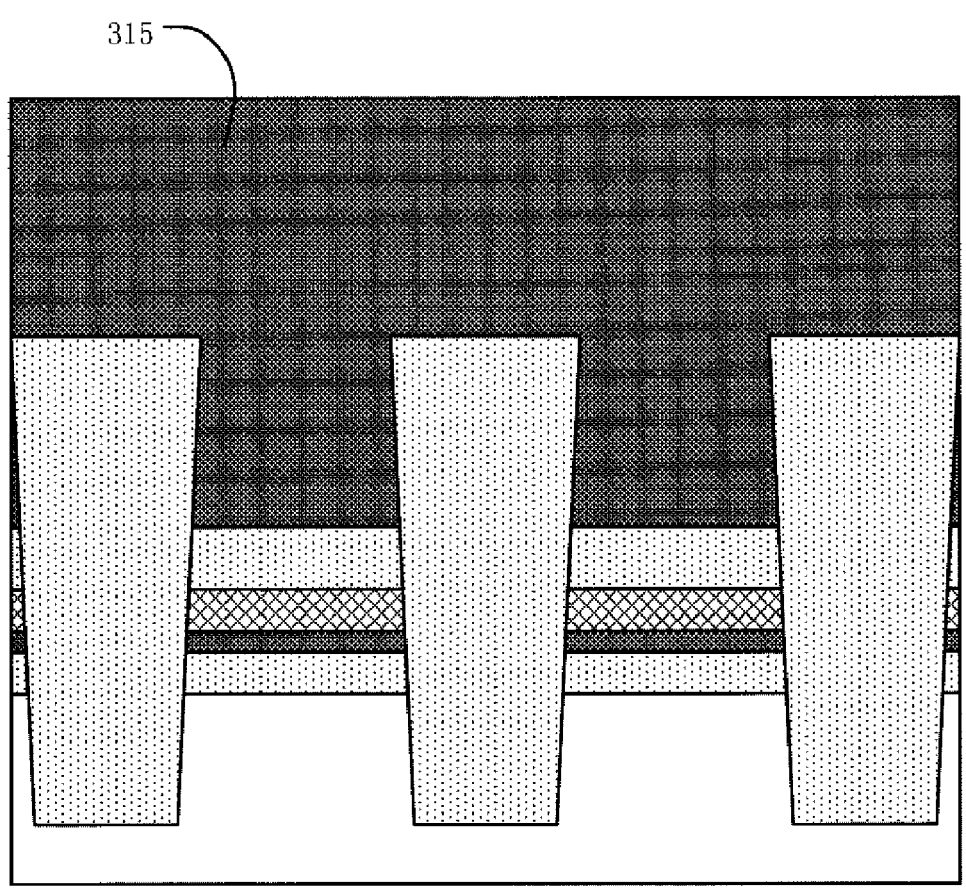
FIG. 17 illustrates a stage in the method for manufacturing a memory array comprising the formation of additional top layer conductive material on the top conductive layer of the structure of FIG. 16 for the purpose of word line definition in accordance with one embodiment.

FIG. 17 illustrates a next stage in the manufacturing process. In this stage, the formation of an additional layer 315 of top conductive layer material is formed over the structure of FIG. 16 for the purposes of the word line definition. In certain embodiments the additional layer 315 comprises polysilicon or other conductor. The layer 315 is then cleaned in preparation for a lithographic step or other patterning step to define the word lines of the array. The pattern for the word lines is etched down at least through the conductive layer 302, or down to the substrate 300 as illustrated in FIG. 18 to create rows of memory cells.

Figure 18:
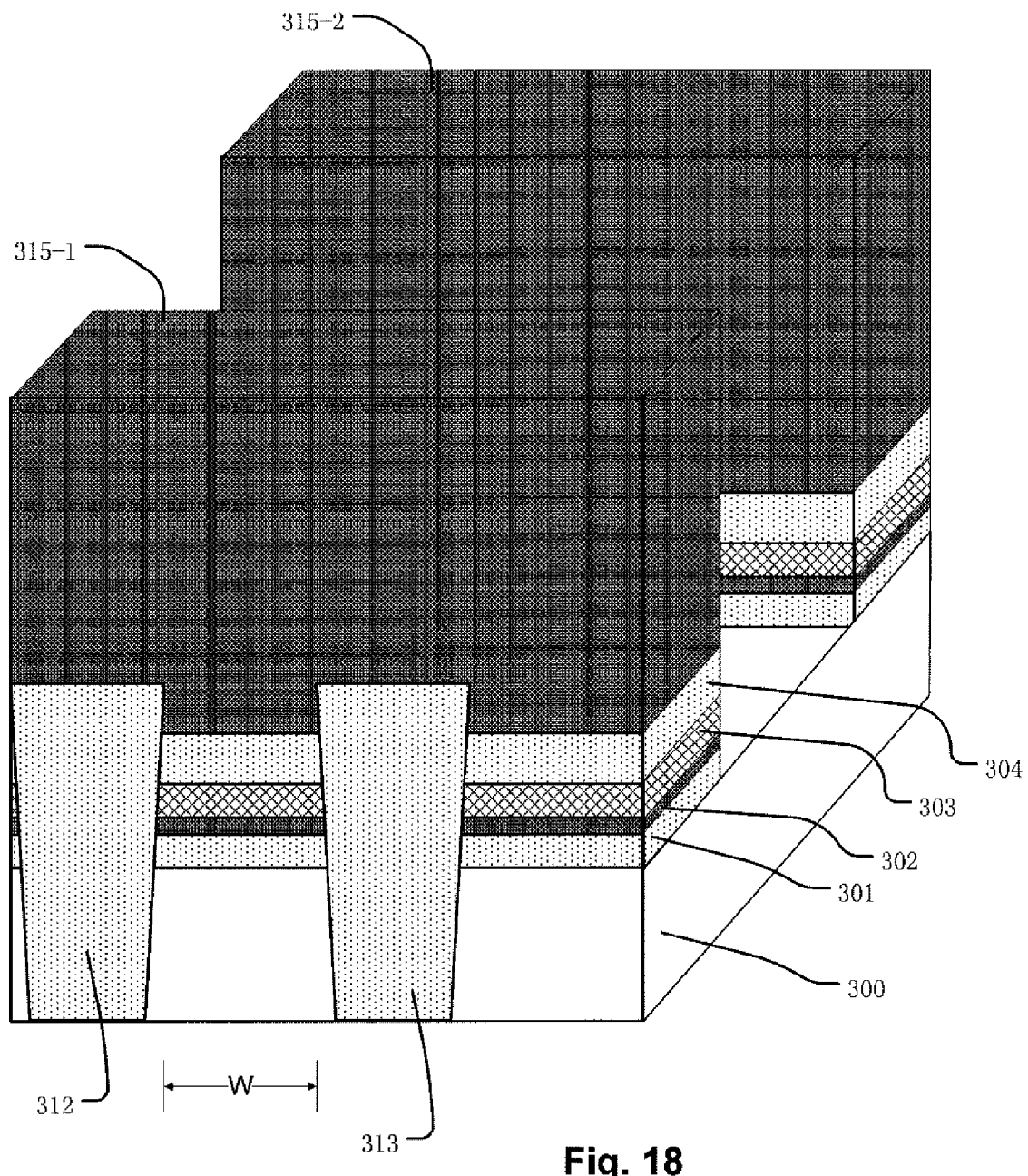
FIG. 18 illustrates a stage in the method for fabricating a memory array comprising etching through the tunneling barrier dielectric structure and all layers and all structures disposed above the tunneling barrier dielectric structure to create rows of memory cells with word lines arranged along the rows in accordance with one embodiment.

FIG. 18 illustrates a part of the resulting structure with a first word line 315-1 and a second word line 315-2 arranged along rows of memory cells. Source and drain terminals are then formed by implanting dopants between the word lines, defining source and drain regions on opposite sides of the word lines, and further processing including providing a dielectric fill between the word lines to isolate the conductive layers in the cells, metal layer patterning and so on is executed to finish the device.

The channel regions of the cells implemented as shown in FIG. 18 have a length between the source and drain regions (not shown) that is defined by the width of the word line 315-1, reduced typically by diffusion of dopants during the implant processes. The width W of the channel is defined by the spacing between the STI structures 312, 313. The length and the width of the channel as defined here establishes an area of the active region of the channel that is less than or equal to the width of the word line 315-1 times the spacing between the STI structures.

The conductive layer 302 in the illustrated structure is substantially planar and has near equal areas on its top and bottom surfaces. The area of the conductive layer 302 is defined by the etching processes that set the spacing between the STI structures and the width of the word lines. Thus, the areas of the top and bottom surfaces of the conductive layer 302 are substantially equal to one another, and substantially equal to the product of the width of the word line and the spacing between the STI structures. Likewise, the area of the top contact for the cell in this embodiment is defined by the etching processes that set the spacing between the STI structures and the width of the word lines. Thus, the areas of the bottom surface of the word line acting as a top contact for the cell is substantially equal to the area of the top surface of the conductive layer, defined by the product of the width of the word line and the spacing between the STI structures.

As can be seen from the perspective view in FIG. 18, the channel region of a representative memory cell as described herein manufactured with processes defining critical features less than 45 nm, has a length between the source and the drain of less than 45 nm, and a width orthogonal to the length of less than 45 nanometers.

In representative embodiments manufactured with processes defining critical features less than 30 nm, has a length between the source and the drain of less than 30 nm, and a width orthogonal to the length of less than 30 nanometers, and wherein the multilayer stack has an effective oxide thickness of about 20 nm or less, and the channel region a width orthogonal to the length less than 1.5 times the effective oxide thickness of the multilayer stack.

In a representative embodiment, the channel width W of the memory cell is less than 45 nm. The effective oxide thickness of a memory cell is based on the dielectric layers in the charge trapping structure, and in one embodiment on the order of 15 to 25 nm. For memory cells having this structure, the channel width may be less than about 1.5 times of the effective oxide thickness of the memory cell calculated as the EOT of the combination of the tunneling barrier dielectric, the charge trapping structure and the top dielectric layer, and more preferably about equal to the effective oxide thickness for the memory cell. Embodiments having a channel width as low as 20 nm or less, and less than the EOT of the memory cells can be implemented using photo resist trimming techniques, phase shift masking, or other sub lithographic patterning technologies.

In certain embodiments, the memory cells can be configured in NAND arrays with channel widths less than 45 nm, and preferably on the order of the EOT of the multilayer stack. The thin conductive layer is above the tunneling barrier dielectric structure, and provides an equal-potential layer to make the electric field distribution even above the channel. The tunneling barrier dielectric structure can consist of a layer of silicon dioxide or silicon oxynitride. Alternatively, the tunneling barrier can consist of a multilayer structure. In embodiments of the memory cell described herein, the effective oxide thickness of the tunneling barrier dielectric structure, whether it is a single layer or multilayer structure, is greater than 3 nm thick, so that the conductive layer is not part of the tunneling barrier. The gate control capability is maintained for a very narrow channel width (W<EOT) device, providing device scaling below 20 nm channel width.

Figure 19:
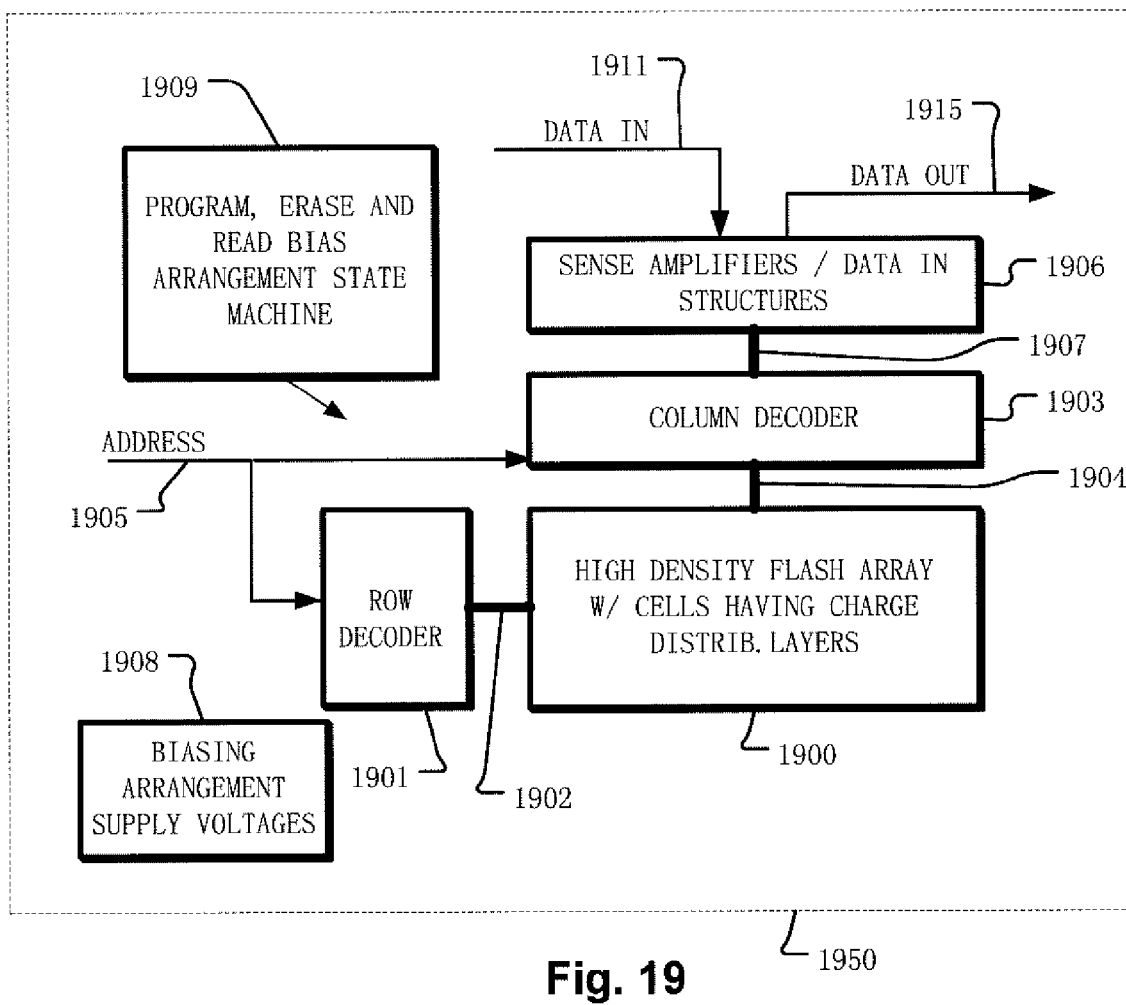
FIG. 19 is a simplified diagram in accordance with one embodiment of an integrated circuit with an array of charge trapping memory cells and control circuitry.

FIG. 19 is a simplified diagram of an integrated circuit with an array of charge trapping memory cells with conductive field distribution layers as described above between a tunneling barrier dielectric and a charge trapping structure. The integrated circuit 1950 includes a memory array 1900 implemented using nonvolatile memory cells as described herein using conductive layers, on a semiconductor substrate. The memory cells of array 1900 may be interconnected in parallel, in series, or in a virtual ground array. A row decoder 1901 is coupled to a plurality of word lines 1902 arranged along rows in the memory array 1900. Memory cells as described herein can be configured in NAND arrays, and NOR arrays, or other types of array structures. A column decoder 1903 is coupled to a plurality of bit lines 1904 arranged along columns in the memory array 1900. Addresses are supplied on bus 1905 to column decoder 1903 and row decoder 1901. Sense amplifiers and data-in structures in block 1906 are coupled to the column decoder 1903 via data bus 1907. Data is supplied via the data-in line 1911 from input/output ports on the integrated circuit 1950, or from other data sources internal or external to the integrated circuit 1950, to the data-in structures in block 1906. Data is supplied via the data-out line 1915 from the sense amplifiers in block 1906 to input/output ports on the integrated circuit 1950, or to other data destinations internal or external to the integrated circuit 1950. A bias arrangement state machine 1909 controls the application of bias arrangement supply voltages 1908, such as for the erase verify and program verify voltages, and the arrangements for programming, erasing, and reading the memory cells, such as with the band-to-band currents. The array may be combined on the integrated circuit with other modules, such as processors, other memory arrays, programmable logic, dedicated logic etc.

While the present invention is disclosed by reference to the preferred embodiments and examples detailed above, it is to be understood that these examples are intended in an illustrative rather than a limiting sense. It is to be understood and appreciated that that the fabrication steps and structures described herein do not cover a complete process flow for the manufacture of entire integrated circuits. The present invention may be practiced in conjunction with various integrated circuit fabrication techniques that are known in the art or to be developed. It is contemplated that modifications and combinations will readily occur to those skilled in the art, which modifications and combinations will be within the spirit of the invention and the scope of the following claims.

What is claimed is:

1. A memory cell comprising:
a semiconductor substrate having a surface with a source region and a drain region in the substrate and separated by a channel region;
a multilayer stack over the channel including a tunneling barrier dielectric structure with an effective oxide thickness of greater than 3 nanometers disposed on the surface of the substrate above the channel region, a conductive layer disposed above the tunneling barrier dielectric structure and above the channel region, a dielectric charge trapping structure disposed above the conductive layer and above the channel region, and a top dielectric structure disposed above the charge trapping structure and above the channel region; and
a word line disposed above the top dielectric structure and above the channel region; wherein the conductive layer in the multilayer stack has an area over the channel region equal within manufacturing limitations to an area of the channel re ion beneath the word line and between the source and drain.

2. The memory cell of claim 1, wherein the channel region has a length between the source and the drain, and a width orthogonal to the length of less than 45 nanometers.

3. The memory cell of claim 1, wherein the multilayer stack has an effective oxide thickness and the channel region has a length between the source and the drain, and a width orthogonal to the length less than 1.5 times the effective oxide thickness of the multilayer stack.

4. A memory cell comprising:
a semiconductor substrate having a surface with a source region and a drain region in the substrate and separated by a channel region;
a multilayer stack over the channel including a tunneling barrier dielectric structure with an effective oxide thickness of greater than 3 nanometers disposed on the surface of the substrate above the channel region, a conductive layer disposed above the tunneling barrier dielectric structure and above the channel region, a dielectric charge trapping structure disposed above the conductive layer and above the channel region, and a top dielectric structure disposed above the charge trapping structure and above the channel region; and
a top conductive layer disposed above the top dielectric structure and above the channel region, wherein the channel region has a length between the source and the drain, and a width orthogonal to the length, and the conductive layer in the multilayer stack has a width that is substantially equal to the width of the channel region and has a length that is substantially equal to the length of the channel region, and
wherein the conductive layer in the multilayer stack has a thickness less than 6 nanometers.

5. The memory cell of claim 1, wherein the tunneling barrier dielectric structure comprises silicon dioxide.

6. The memory cell of claim 1, wherein the tunneling barrier dielectric structure comprises silicon oxynitride.

7. The memory cell of claim 1, wherein the tunneling barrier dielectric structure comprises a bandgap engineered tunneling barrier structure.

8. The memory cell of claim 7, wherein the conductive layer comprises doped semiconductor material.

9. A memory cell comprising:
- a semiconductor substrate having a surface with a source region and a drain region in the substrate and separated by a channel region;
- a multilayer stack over the channel including a tunneling barrier dielectric structure with an effective oxide thickness of greater than 3 nanometers disposed on the surface of the substrate above the channel region, a conductive layer disposed above the tunneling barrier dielectric structure and above the channel region, a dielectric charge trapping structure disposed above the conductive layer and above the channel region, and a top dielectric structure disposed above the charge trapping structure and above the channel region; and
- a top conductive layer disposed above the top dielectric structure and above the channel region, wherein the conductive layer in the multilayer stack has a thickness less than 6 nanometers.

10. The memory cell of claim 1, wherein the conductive layer comprises metal.

11. The memory cell of claim 1, wherein the charge trapping structure comprises silicon nitride.

12. The memory cell of claim 1, wherein the charge trapping structure comprises a silicon dioxide layer and a silicon nitride layer disposed above the silicon dioxide layer.

13. A memory device comprising:
- an array of memory cells on a semiconductor substrate arranged in a plurality of NAND strings;
- the memory cells in the respective NAND strings being coupled in series, and comprising a source region and a drain region in the substrate and separated by a channel region, a tunneling barrier dielectric structure with an effective oxide thickness of greater than 3 nanometers disposed above the channel region, a conductive layer disposed above the tunneling barrier dielectric structure and above the channel region, a dielectric charge trapping structure disposed above the conductive layer and above the channel region, a top dielectric structure disposed above the charge trapping structure, and a top conductive layer disposed above the top dielectric structure and above the channel region;
- a row decoder;
- a column decoder;
- sense amplifiers;
- at least one input port;
- at least one output port;
- data-in structures; and
- bias arrangement state machine.

* * * * *

UNITED STATES PATENT AND TRADEMARK OFFICE
CERTIFICATE OF CORRECTION

| | | |
|---|---|---|
| PATENT NO. | : 8,101,989 B2 | Page 1 of 1 |
| APPLICATION NO. | : 11/756559 | |
| DATED | : January 24, 2012 | |
| INVENTOR(S) | : Hang-Ting Lue | |

It is certified that error appears in the above-identified patent and that said Letters Patent is hereby corrected as shown below:

In claim 1, column 12, line 34, delete "re ion" and insert the word -- region --.

Signed and Sealed this
First Day of May, 2012

David J. Kappos
*Director of the United States Patent and Trademark Office*